(12) United States Patent
Meyer, IV et al.

(10) Patent No.: US 8,134,834 B2
(45) Date of Patent: Mar. 13, 2012

(54) CLAMP-TYPE HEAT SINK FOR MEMORY

(75) Inventors: George Anthony Meyer, IV, San Jose, CA (US); Chien-Hung Sun, Zhongli (TW); Chieh-Ping Chen, Zhongli (TW); Hsien-Tsang Liu, Zhongli (TW)

(73) Assignee: Celsia Technologies Taiwan, Inc., Taoyuan County (TW)

( * ) Notice: Subject to any disclaimer, the term of this patent is extended or adjusted under 35 U.S.C. 154(b) by 144 days.

(21) Appl. No.: 12/818,341

(22) Filed: Jun. 18, 2010

(65) Prior Publication Data

US 2011/0310563 A1    Dec. 22, 2011

(51) Int. Cl.
*H05K 7/20* (2006.01)
(52) U.S. Cl. ....... 361/700; 361/715; 361/719; 165/80.3; 165/80.4; 165/104.26
(58) Field of Classification Search .................. None
See application file for complete search history.

(56) References Cited

U.S. PATENT DOCUMENTS

| | | | | |
|---|---|---|---|---|
| 7,349,220 B2 * | 3/2008 | Lai et al. | ....................... | 361/719 |
| 7,626,823 B2 * | 12/2009 | Yang et al. | ..................... | 361/719 |
| 7,990,699 B2 * | 8/2011 | Lian et al. | ................ | 361/679.47 |
| 8,059,406 B1 * | 11/2011 | Meyer et al. | ................... | 361/701 |
| 2010/0134982 A1 * | 6/2010 | Meyer et al. | .................. | 361/715 |

* cited by examiner

*Primary Examiner* — Boris Chervinsky
(74) *Attorney, Agent, or Firm* — Chun-Ming Shih; HDLS IPR Services

(57) ABSTRACT

A clamp-type heat sink for a memory includes two heat conducting modules, a pivot shaft, and an elastic element. The heat conducting module includes an isothermal vapor chamber plate and a heat dissipating body coupled to the isothermal vapor chamber plate. The heat dissipating body includes a base plate and heat dissipating fins extended from the base plate. The base plate includes a shaft hole for passing the pivot shaft, such that each heat dissipating body is installed serially, and the elastic element is sheathed onto the pivot shaft and includes two elastic arms extended from the elastic element and abutted against each heat dissipating body, such that each isothermal vapor chamber plate is clamped and attached onto an external side of the memory to improve the convenience and integrity of the assembling and removal process to achieve a quick assembling or removal effect and prevent the components from missing.

10 Claims, 6 Drawing Sheets

CLAMP-TYPE HEAT SINK FOR MEMORY

BACKGROUND OF THE INVENTION

1. Field of the Invention

The present invention relates to a heat dissipating device, in particular to a clamp-type heat sink used in a memory.

2. Description of Prior Art

As science and technology advance, computer hardware tends to come with increasingly higher speed and frequency for improving efficiency and performance. In addition, a memory is generally used as a storage device in a computer system for saving and transmitting digital signals and improving the computing speed of a central processing unit, and thus the memory usually has a design with high speed and frequency regardless of its operating clock or transmission bandwidth. In the meantime, the heat generated during the operation of the memory is increased rapidly, and the continuous rising temperature may affect the operation performance of the memory or may even damage the memory.

Therefore, a heat sink used for memories is introduced, and a conventional heat sink usually comprises two metal plates and a plurality of fasteners. The two metal plates are attached onto both lateral surfaces of the memory, and each fastener clamps the two metal plates, such that the memory can be clamped and fixed by the two metal plates, and the large heat generated from the operation of the memory can be dissipated through the two metal plates.

However, when the heat sink is combined with the memory, it is necessary to press the two metal plates onto both sides of the memory and clamp each fastener. Obviously, the assembling and removal procedures of the conventional heat sink are relatively complicated and inconvenient, and the two metal plates and each fastener are detachable, so that after the heat sink is removed from the memory, each module may be lost or missing easily.

In view of the foregoing drawbacks, the inventor of the present invention based on years of experience in the related industry to conduct extensive researches and experiments, and finally developed a feasible and effective design in accordance with the present invention.

SUMMARY OF THE INVENTION

Therefore, it is a primary objective of the present invention to overcome the shortcomings of the prior art by providing a clamp-type heat sink for a memory to improve the convenience and integrity of the assembling and removal of the heat sink, so as to achieve a quick removal effect and avoid the components from being lost or missing.

To achieve the foregoing objective, the present invention discloses a clamp-type heat sink for a memory, and the clamp-type heat sink comprises:

a pair of isothermal vapor chamber plates;

a pair of heat dissipating bodies, coupled to the pair of isothermal vapor chamber plates respectively, and each heat dissipating body including a base plate and a plurality of heat dissipating fins extended from the base plate, and the base plate having a shaft hole formed thereon;

a pivot shaft, with both ends passed through and connected to the shaft holes respectively, such that the pair of heat dissipating bodies are installed serially; and an elastic element, sheathed onto an exterior of the pivot shaft, and including two elastic arms extended from the elastic element and abutted against the pair of the heat dissipating bodies respectively, such that the pair of isothermal vapor chamber plates are clamped onto and attached in a direction towards external sides of the memory.

To achieve the foregoing objective, the present invention further adopts another technical measure to provide a clamp-type heat sink for a memory, and the clamp-type heat sink comprises:

a pair of heat conducting modules, each including a heat dissipating body, and the heat dissipating body including a base plate and a shaft hole formed on the base plate;

a pivot shaft, with both ends passed and coupled into the shaft holes respectively, such that the heat dissipating bodies are installed serially; and an elastic element, sheathed onto an exterior of the pivot shaft, and including two elastic arms extended from the elastic element and abutted against upper half portions of the pair of heat conducting modules respectively, such that lower half portions of the pair of heat conducting modules are clamped onto and attached to external sides of the memory.

Compared with the prior art, the present invention has the following effects:

The clamp-type heat sink can be installed onto a memory or removed from the memory easily by the aforementioned clamping method, and the operation is quick, simple, easy and convenient.

Each module is linked in a combination, so that it is not necessary to remove and separate each module in an assembling process or a removal process, so as to prevent the module from being lost and missing.

DETAILED DESCRIPTION OF THE INVENTION

The detailed description and technical contents of the present invention will become apparent with the following detailed description accompanied with related drawings. It is noteworthy to point out that the drawings is provided for the illustration purpose only, but not intended for limiting the scope of the present invention.

Figure 1:
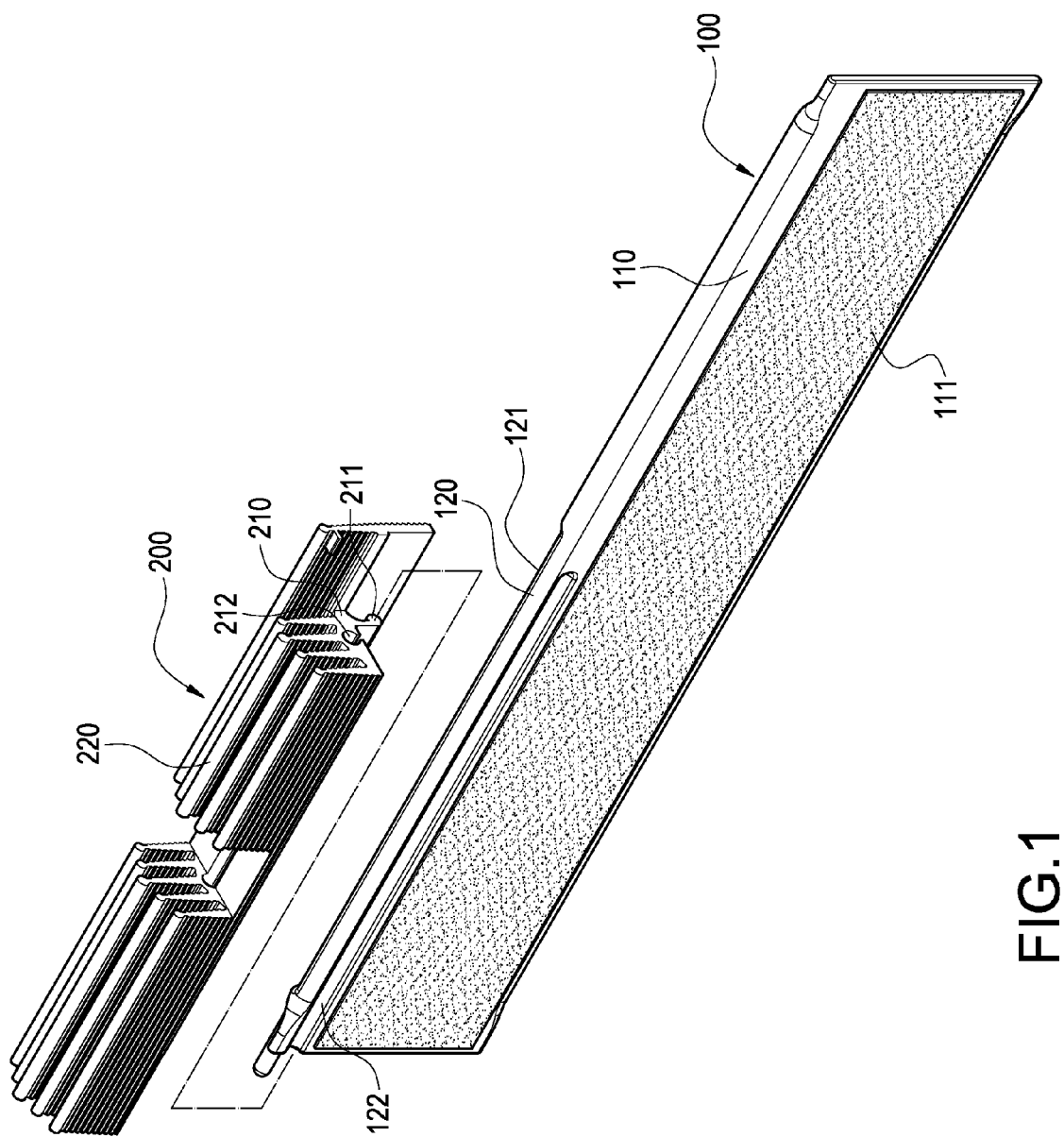
FIG. 1 is an exploded view, showing a portion of components of the present invention.
Figure 2:
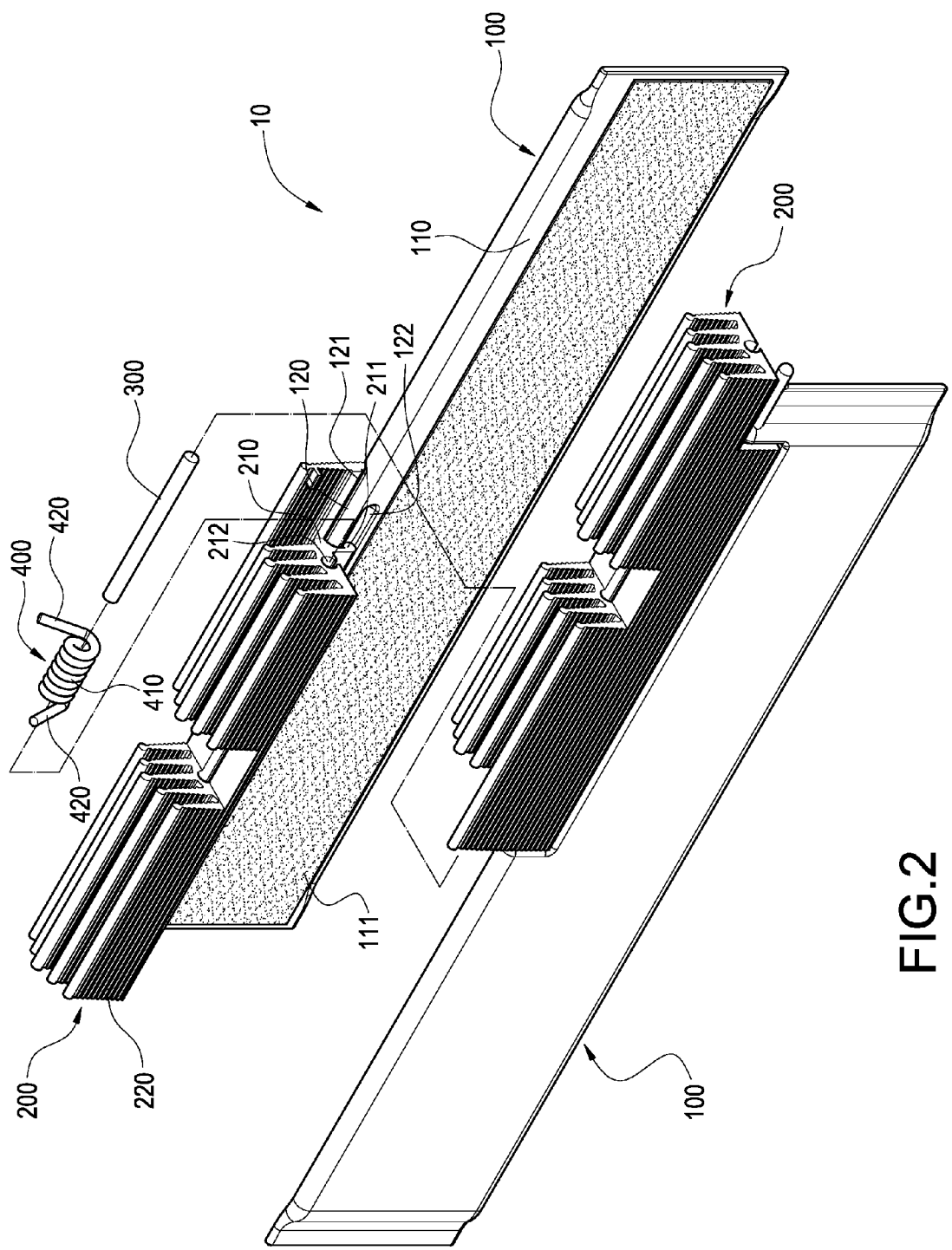
FIG. 2 is an exploded view of the present invention.
Figure 3:
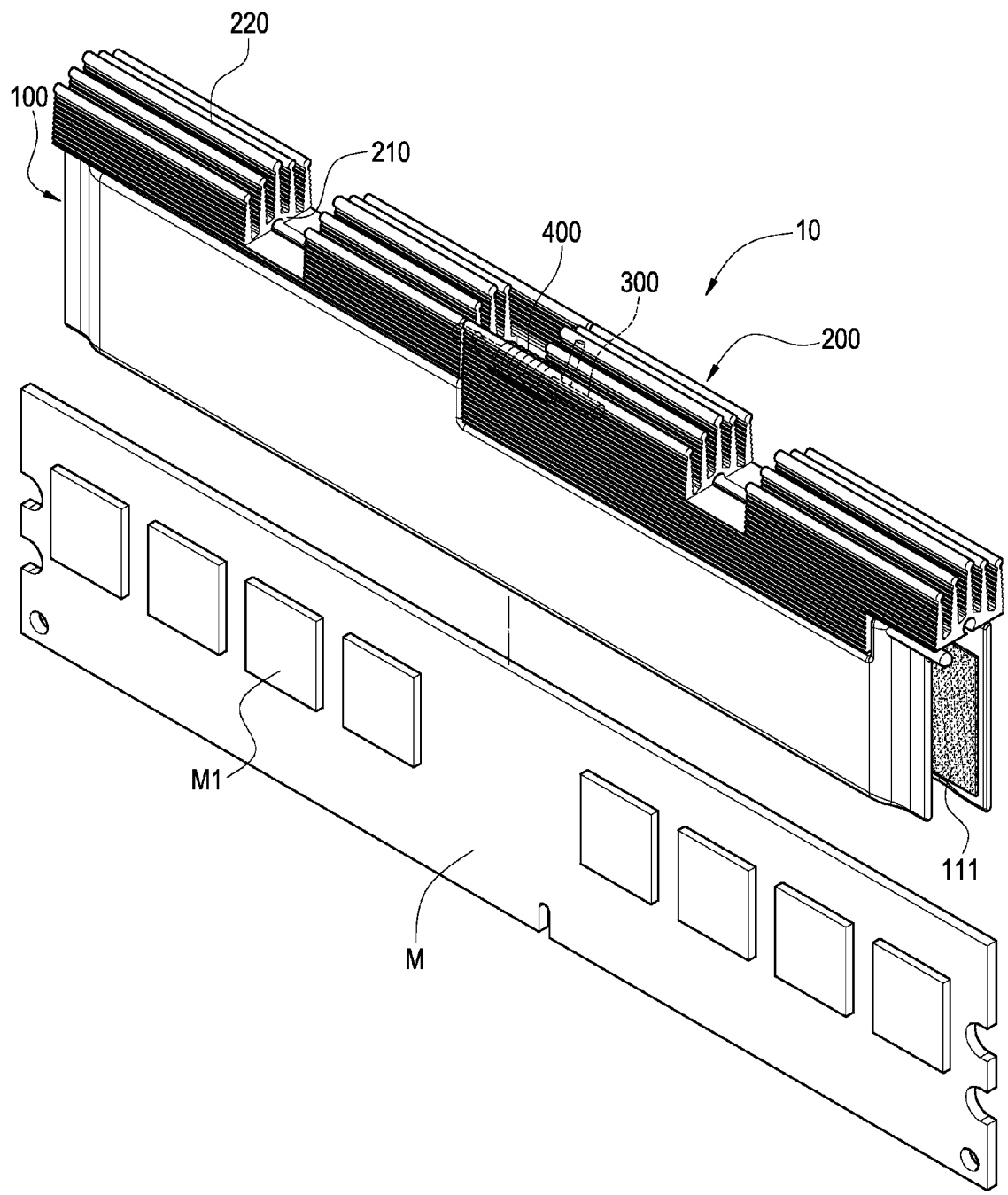
FIG. 3 is a perspective view of the present invention before a memory is installed.

With reference to FIGS. 1 to 3 of a clamp-type heat sink for a memory in accordance with the present invention, the clamp-type heat sink is clamped onto a memory M and provided for dissipating heat, and the clamp-type heat sink for a memory comprises a pair of heat conducting modules 10, a pivot shaft 300 and an elastic element 400.

The heat conducting modules 10 are installed opposite to each other, and each heat conducting module 10 includes an isothermal vapor chamber plate 100 and a heat dissipating body 200. The clamp-type heat sink is further defined, and it comprises a pair of isothermal vapor chamber plates 100, a pair of heat dissipating bodies 200, a pivot shaft 300 and an elastic element 400.

The structure of each isothermal vapor chamber plate 100 is identical, and the isothermal vapor chamber plates are installed opposite to each other, and the lengthwise direction of each isothermal vapor chamber plate 100 is the same, and the isothermal vapor chamber plate 100 is in a shape of a flat rectangular plate, but the invention is not limited to such shape only. The isothermal vapor chamber plate 100 includes the working fluid and a capillary tissue, such that a gas-liquid phase change of the working fluid can be used for achieving a thermal conduction mechanism.

The isothermal vapor chamber plates 100 are formed at an upper half portion of the heat conducting module 10, and each isothermal vapor chamber plate 100 includes a clamping portion 110 and a joint portion 120 formed and extended from the clamping portion 110, wherein the clamping portion 110 is formed at a lower half portion of the isothermal vapor chamber plate 100, and the joint portion 120 is formed at an upper half portion of the isothermal vapor chamber plate 100, and each joint portion 120 is formed at a position of a different half portion and installed alternately.

A heat conducting medium 111 is attached onto a lower half portion of the heat conducting module 10, and more specifically, the heat conducting medium 111 is attached onto an internal side of the clamping portion 110 of the isothermal vapor chamber plate 100. A chip M1 is installed separately on both sides of the memory M, and a heat conducting medium 111 is provided for attaching the chip M1, such that the heat generated by the chip Ml can be conducted to the isothermal vapor chamber plate 100 and dissipated from the heat dissipating body 200 quickly.

A ditch 121 is formed on an external side of the joint portion 120, and an embedding slot 122 is formed on an internal side of the joint portion 120.

Each heat dissipating body 200 has identical structure and is coupled to each isothermal vapor chamber plate 100; more specifically, each heat dissipating body 200 is coupled to each joint portion 120, and the heat dissipating body 200 is made of a good thermal conductive material including but not limited to a metal.

Each heat dissipating body 200 comprises a base plate 210 and a plurality of heat dissipating fins 220.

A base plate 210 includes a latch hook 211 protruded from the bottom of the base plate 210 for latching into the embedding slot 122. A shaft hole 212 is formed on the base plate 210 and along the lengthwise direction of the heat conducting module 10; more specifically, the shaft hole 212 is formed along the lengthwise direction of the isothermal vapor chamber plate 100.

Each heat dissipating fin 220 is formed at a top surface of the base plate 210. In other words, each heat dissipating fin 220 is formed and extended from the base plate 210, and at an upper half portion of each heat conducting module 10, and each heat dissipating fin 220 is erected and arranged apart from each other. Each heat dissipating fin 220 is formed on the base plate 210 by a soldering, insertion or integral formation method. However, the invention is not limited to these methods only. Each heat dissipating fin 220 can improve the overall heat dissipating effect of the heat dissipating device.

A portion of the heat dissipating fin 220 situated at the utmost outer side of the base plate 210 is contained in the ditch 121. In other words, the joint portion 120 is provided for attaching the base plate 210 with the utmost outer heat dissipating fins 220, and the isothermal vapor chamber plate 100 is clamped at the base plate 210 and disposed between the heat dissipating fins 220 at the utmost outer sides of the base plate 210 and fixed to the heat dissipating body 200.

Both ends of the pivot shaft 300 are passed through and coupled to each shaft hole 212 separately, such that each heat dissipating body 200 is installed serially along a lengthwise direction of any one isothermal vapor chamber plate 100, so that each base plate 210 can be installed serially.

The elastic element 400 is sheathed onto an exterior of the pivot shaft 300, and two elastic arms 420 are extended from the elastic element 400 and each elastic arm 420 is abutted against an upper half portion of each heat conducting module 10; more specifically, the elastic element 400 includes two elastic arms 420 extended from the elastic element 400 and each elastic arm 420 is abutted against each heat dissipating body 200.

For further description, the elastic element 400 includes a spring coil 410 and two elastic arms 420, and each elastic arm 420 is formed and extended separately from both ends of the spring coil 410.

The spring coil 410 is sheathed onto an exterior of the pivot shaft 300 and clamped between the serially installed base plates 210, and each elastic arm 420 is elastically abutted against the upper half portion of each heat conducting module 10, such that a lower half portion of each heat conducting module 10 is clamped and attached in a direction towards an external side of the memory M; more specifically, each elastic arm is elastically abutted against each heat dissipating body 200, such that each isothermal vapor chamber plate 100 is clamped and attached in a direction towards an external side of the memory M.

Figure 4:
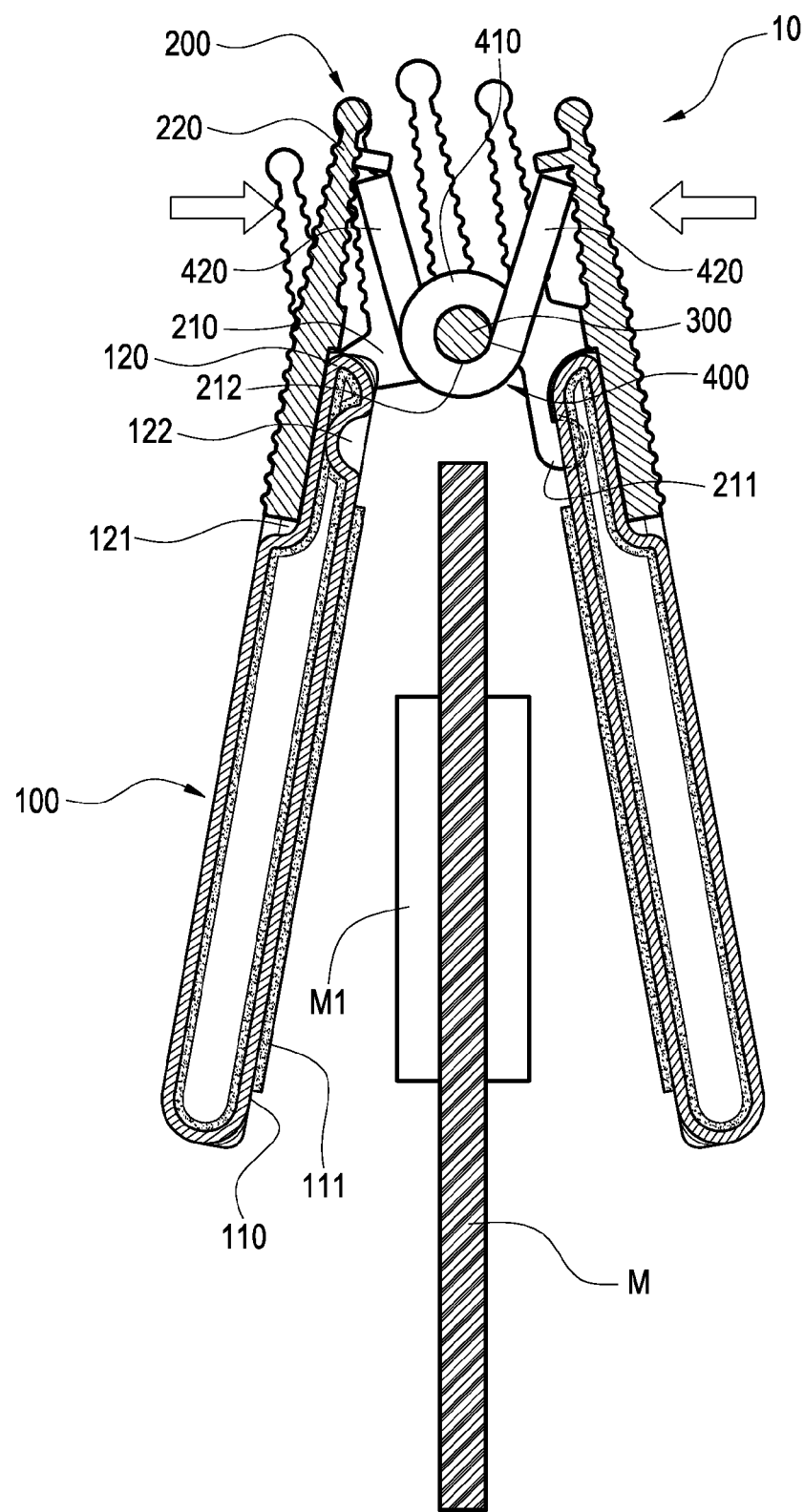
FIG. 4 is a side view of the present invention before a heat sink is clamped on external sides of a memory.
Figure 5:
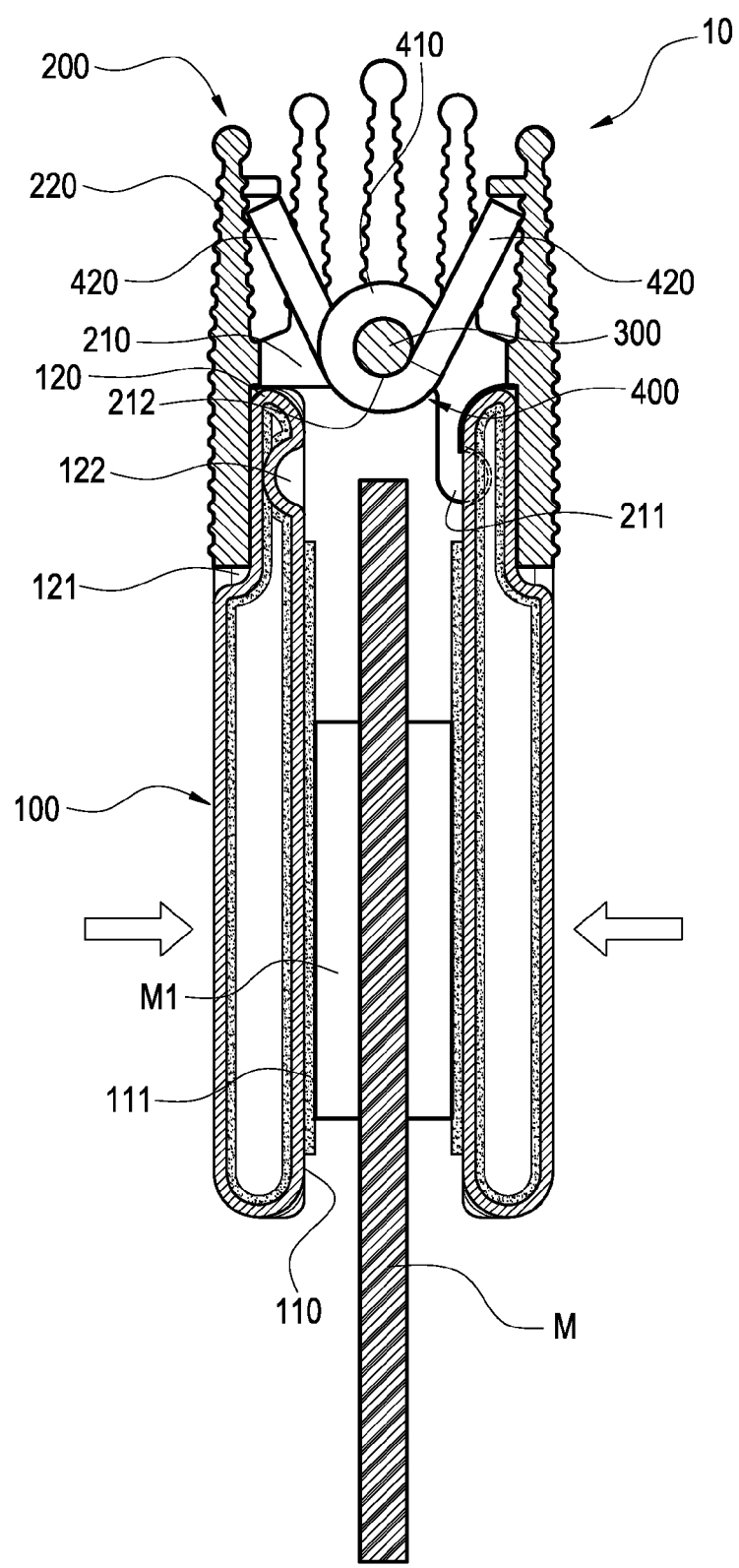
FIG. 5 is a side view of the present invention after a heat sink is clamped on external sides of a memory.
Figure 6:
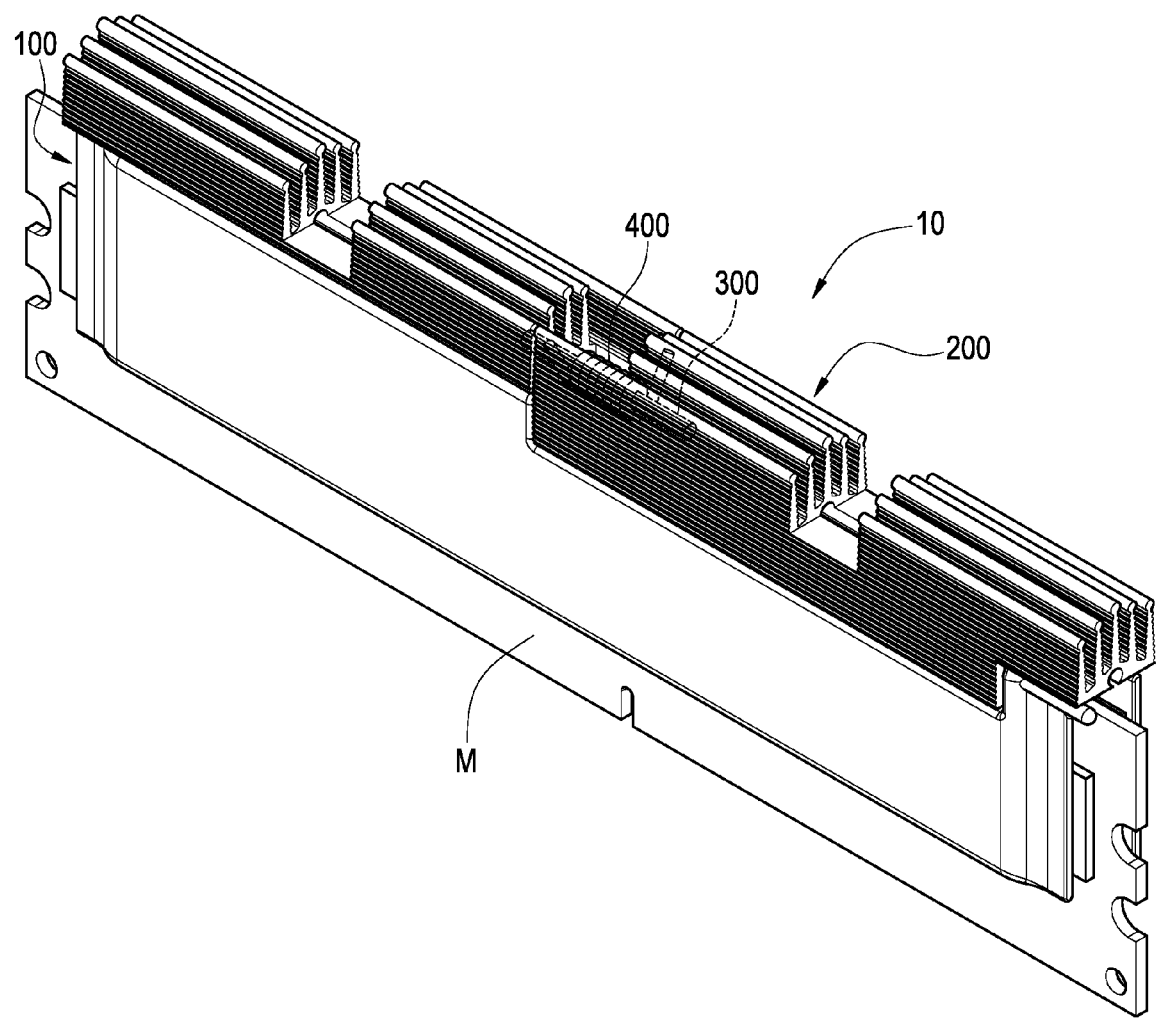
FIG. 6 is a perspective view of the present invention, after a memory is installed.

With reference to FIGS. 4 to 6 for an application of the present invention, an external force is applied to engage the upper half portion of each heat conducting module 10. Now, each heat conducting module 10 is turned over by using the pivot shaft 300 as an axle center, so that the lower half portion of each heat conducting module 10 is separated to spread open each isothermal vapor chamber plate 100 and allow the memory M to be placed between the isothermal vapor chamber plates 100, and further elastically compress the elastic element 400 to provide a stronger elastic restoring force.

If the external force is released, the elastic restoring force of the elastic element 400 will push each elastic arm 420 to abut the upper half portion of each heat conducting module 10. In other words, each elastic arm 420 is abutted against each respective heat dissipating body 200 to separate and spread open the upper half portion of each heat conducting module 10 quickly. Now, each heat conducting module 10 is pivotally turned upside down by using the pivot shaft 300 as an axle center, such that the lower half portion of each heat conducting module 10 is engaged to clamp the memory M, such that each isothermal vapor chamber plate 100 is engaged to clamp the memory M and conduct the heat generated by the memory M to each isothermal vapor chamber plate 100, and each heat dissipating body 200 is provided for dissipating the heat.

Each heat conducting medium 111 is attached to each chip M1, and the heat conducting medium 111 conducts the heat generated during the operation of the chip M1 to the isothermal vapor chamber plate 100, and a gas-liquid phase change occurred in the isothermal vapor chamber plate 100 expedites the heat conduction, and the powerful heat convection function of each heat dissipating fin 220 dissipates a large quantity of heat from the chip M1 quickly.

In addition, the resilient force of the elastic element 400 drives each heat conducting medium 111 to be attached closely with each chip M1, not just increasing the strength of clamping the present invention onto the memory M only, but also improving the engaging level of the attachment to reduce the thermal resistance of the contact between the present invention and the memory M.

The present invention can be installed at the memory M or removed from the memory M quickly, simply, easily and conveniently. The invention allows manufacturers to combine the present invention with the memory M first and then insert the memory M onto an insert slot of a circuit board, or insert the memory M into the insert slot of the circuit board before clamping and fixing the present invention onto the memory M, so as to achieve a free elastic application.

In summation of the description above, the present invention improves over the prior art and complies with patent application requirements, and thus is duly filed for patent application. While the invention has been described by means of specific embodiments, numerous modifications and variations could be made thereto by those skilled in the art without departing from the scope and spirit of the invention set forth in the claims.

What is claimed is:

1. A clamp-type heat sink for a memory, comprising:
a pair of isothermal vapor chamber plates;
a pair of heat dissipating bodies, coupled to the pair of isothermal vapor chamber plates respectively, and each heat dissipating body including a base plate and a plurality of heat dissipating fins extended from the base plate, and the base plate having a shaft hole formed thereon;
a pivot shaft, with both ends passed through and connected to the shaft holes respectively, such that the pair of heat dissipating bodies are installed serially; and
an elastic element, sheathed onto an exterior of the pivot shaft, and including two elastic arms extended from the elastic element and abutted against the pair of the heat dissipating bodies respectively, such that the pair of isothermal vapor chamber plates are clamped onto and attached in a direction towards external sides of the memory.

2. The clamp-type heat sink for a memory as recited in claim 1, wherein the isothermal vapor chamber plate includes heat conducting medium attached thereon.

3. The clamp-type heat sink for a memory as recited in claim 1, wherein the isothermal vapor chamber plate includes a clamping portion and a joint portion formed and extended from the clamping portion, and the heat dissipating body is coupled to the joint portion.

4. The clamp-type heat sink for a memory as recited in claim 3, wherein the joint portion includes an embedding slot formed thereon, and the base plate includes a latch hook formed thereon and latched into the embedding slot.

5. The clamp-type heat sink for a memory as recited in claim 1, wherein the shaft hole is formed in a direction along the lengthwise direction of the isothermal vapor chamber plate.

6. The clamp-type heat sink for a memory as recited in claim 1, wherein the elastic element includes a spring coil sheathed onto an exterior of the pivot shaft, and the two elastic arms are formed and extended from both ends of the spring coil.

7. A clamp-type heat sink for a memory, comprising:
a pair of heat conducting modules, each including a heat dissipating body, and the heat dissipating body including a base plate, and the base plate including a shaft hole formed thereon;
a pivot shaft, with both ends passed through and coupled to the shaft holes respectively, such that the pair of heat dissipating bodies are installed serially; and
an elastic element, sheathed onto an exterior of the pivot shaft, and including two elastic arms extended from the elastic element and abutted against at upper half portions of the pair of heat conducting modules respectively, such that lower portions of the pair of heat conducting modules are clamped onto and in a direction towards external sides of the memory.

8. The clamp-type heat sink for a memory as recited in claim 7, wherein the heat conducting module includes a heat conducting medium attached thereon.

9. The clamp-type heat sink for a memory as recited in claim 7, wherein the shaft hole is formed in a direction along the lengthwise direction of the heat conducting module.

10. The clamp-type heat sink for a memory as recited in claim 7, wherein the elastic element includes a spring coil sheathed onto an exterior of the pivot shaft, and the two elastic arms are formed and extended from both ends of the spring coil respectively.

* * * * *